US012610830B2

(12) United States Patent
Nishiyama et al.

(10) Patent No.: US 12,610,830 B2
(45) Date of Patent: Apr. 21, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Taketo Nishiyama, Tokyo (JP); Kenji Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 426 days.

(21) Appl. No.: 18/466,228

(22) Filed: Sep. 13, 2023

(65) Prior Publication Data

US 2024/0332139 A1 Oct. 3, 2024

(30) Foreign Application Priority Data

Mar. 28, 2023 (JP) ................................. 2023-052031

(51) Int. Cl.
| | |
|---|---|
| *H01L 23/495* | (2006.01) |
| *H01L 21/56* | (2006.01) |
| *H01L 23/053* | (2006.01) |
| *H01L 23/31* | (2006.01) |
| *H01L 23/498* | (2006.01) |
| *H01L 23/00* | (2006.01) |

(52) U.S. Cl.
CPC ........ *H01L 23/49551* (2013.01); *H01L 21/56* (2013.01); *H01L 23/053* (2013.01); *H01L 23/3121* (2013.01); *H01L 23/49811* (2013.01); *H01L 23/49861* (2013.01); *H01L 24/32* (2013.01); *H01L 2224/32225* (2013.01)

(58) Field of Classification Search
CPC ................ H01L 2224/4005; H01L 2224/4001
See application file for complete search history.

(56) References Cited

U.S. PATENT DOCUMENTS

| | | | |
|---|---|---|---|
| 2009/0091007 A1* | 4/2009 | Tellkamp | .......... H01L 23/49548 438/112 |
| 2021/0118815 A1* | 4/2021 | Kosugi | ................... H01L 24/73 |
| 2021/0159157 A1* | 5/2021 | Lee | ......................... H01L 24/40 |

FOREIGN PATENT DOCUMENTS

| | | |
|---|---|---|
| JP | H10-22451 A | 1/1998 |
| JP | 2022-6924 A | 1/2022 |
| WO | 2019/234984 A1 | 12/2019 |

* cited by examiner

*Primary Examiner* — Lauren R Bell
(74) *Attorney, Agent, or Firm* — Studebaker Brackett PLLC

(57) ABSTRACT

A lead frame connects a metal wiring and an electrode of a case. A seal material is filled in the case. The lead frame includes a first joint portion joined to the metal wiring, a second joint portion joined to the electrode, and a connection portion connecting the first joint portion and the second joint portion. The connection portion includes an inclined portion inclined with respect to the upper surface of the insulating substrate on a cross-section across an extension direction of the lead frame, a first non-inclined portion provided between the inclined portion and the first joint portion, and a second non-inclined portion provided between the inclined portion and the second joint portion. Slits are provided on both sides of the lead frame at a boundary of the first non-inclined portion and the inclined portion and a boundary of the second non-inclined portion and the inclined portion.

14 Claims, 7 Drawing Sheets

SEMICONDUCTOR DEVICE AND METHOD FOR MANUFACTURING SEMICONDUCTOR DEVICE

BACKGROUND OF THE INVENTION

Field

The present disclosure relates to a semiconductor device and a method for manufacturing the semiconductor device.

Background

If air bubbles remain under a lead frame when a seal material is injected, insulation breakdown occurs as a result of an insulation distance decreasing. In addition, the lead frame is peeled by a temperature cycle due to a difference in an expansion rate between the air bubbles and the seal material, which shortens the life. To address this, a configuration in which a pass-through slot is provided at a lead frame to let out air bubbles has been proposed (for example, see Patent Literature 1).

CITATION LIST

Patent Literature

Patent Literature 1: JP 2022-6924 A

SUMMARY

However, if a distance to be moved by air bubbles trapped under a lead frame to a pass-through slot is long, the air bubbles are less likely to be let out. Thus, there is a problem that this leads to decrease in reliability of a power module or an insulation failure.

The present disclosure has been made to solve the problem as described above and is directed to providing a semiconductor device capable of preventing decrease in reliability and an insulation failure and a method for manufacturing the semiconductor device.

Solution to Problem

A first semiconductor device according to the present disclosure includes: an insulating substrate; a metal wiring provided on an upper surface of the insulating substrate; a case joined to a peripheral portion on the upper surface of the insulating substrate; a semiconductor chip mounted on the upper surface of the insulating substrate inside the case; an electrode provided in the case; a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion, the connection portion includes an inclined portion inclined with respect to the upper surface of the insulating substrate on a cross-section across an extension direction of the lead frame, a first non-inclined portion provided between the inclined portion and the first joint portion, and a second non-inclined portion provided between the inclined portion and the second joint portion, and slits are provided on both sides of the lead frame at a boundary of the first non-inclined portion and the inclined portion and a boundary of the second non-inclined portion and the inclined portion.

A second semiconductor device according to the present disclosure includes: an insulating substrate; a metal wiring provided on an upper surface of the insulating substrate; a case joined to a peripheral portion on the upper surface of the insulating substrate; a semiconductor chip mounted on the upper surface of the insulating substrate inside the case; an electrode provided in the case; a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion, the connection portion includes an inclined portion, a thickness of the inclined portion changes in a width direction of the lead frame, and a lower surface of the inclined portion is inclined with respect to the upper surface of the insulating substrate on a cross-section across an extension direction of the lead frame.

Advantageous Effects of Invention

In the present disclosure, the inclined portion is provided in the lead frame. Thus, air below the inclined portion of the lead frame is likely to be extruded above when the seal material is injected. Thus, the air bubbles are less likely to be trapped under the lead frame, so that it is possible to prevent decrease in reliability and an insulation failure.

DESCRIPTION OF EMBODIMENTS

A semiconductor device and a method for manufacturing the semiconductor device according to the embodiments of the present disclosure will be described with reference to the drawings. The same components will be denoted by the same symbols, and the repeated description thereof may be omitted.

First Embodiment

Figure 1:
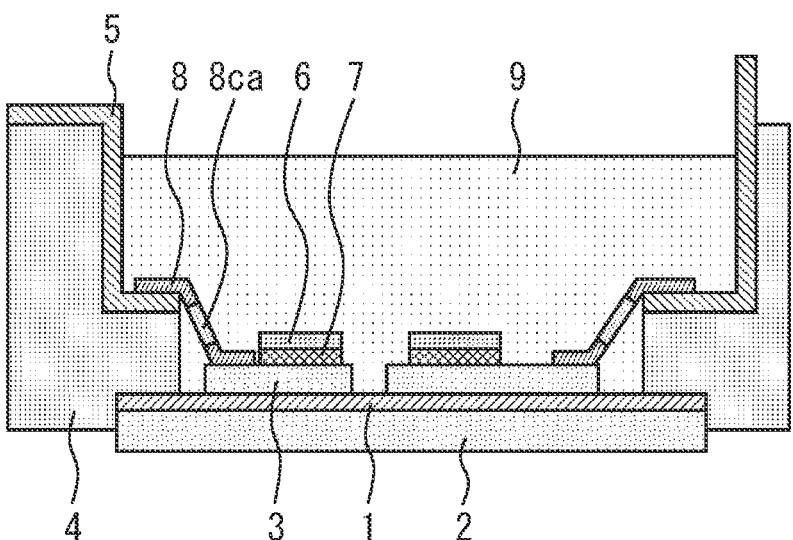
FIG. 1 is a cross-section view illustrating a semiconductor device according to a first embodiment.

FIG. 1 is a cross-section view illustrating a semiconductor device according to a first embodiment. A heat radiation plate 2 is provided on a lower surface of an insulating substrate 1. A metal wiring 3 is provided at a central portion on an upper surface of the insulating substrate 1. A case 4 is joined to a peripheral portion on the upper surface of the insulating substrate 1 so as to enclose the metal wiring 3.

A step is provided on an upper surface of the case 4, so that an upper surface on an inner periphery side of the case 4 is lower than an upper surface on an outer periphery side of the case 4. An electrode 5 is provided inside the case 4. The electrode 5 is drawn above the case 4 from the upper surface on the inner periphery side of the case 4.

A semiconductor chip 6 is mounted on the insulating substrate 1 inside the case 4. A lower electrode of the semiconductor chip 6 is joined to the metal wiring 3 with solder 7 and is electrically connected to the metal wiring 3. An upper electrode of the semiconductor chip 6 is wire-connected to another metal wiring (not illustrated). A lead frame 8 connects the metal wiring 3 and the electrode 5 of the case 4.

The case 4 is filled with a seal material 9 to seal the upper surface of the insulating substrate 1, the semiconductor chip 6, the lead frame 8, and the like. The lead frame 8 is not exposed from the seal material 9. The seal material 9 is a fluid gel or resin. Note that while the resin is cured in a completed device, the resin has fluidity before being cured upon manufacturing.

Figure 2:
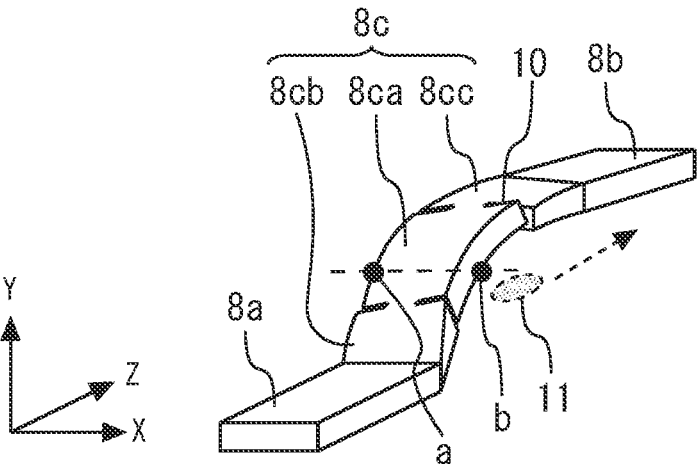
FIG. 2 is a perspective view illustrating a lead frame according to the first embodiment.

FIG. 2 is a perspective view illustrating the lead frame according to the first embodiment. The lead frame 8 is formed by bending a flat plate having a fixed thickness. The lead frame 8 includes a first joint portion 8a that is solder-joined to the metal wiring 3, a second joint portion 8b that is solder-joined to the electrode 5 provided on the upper surface on the inner periphery side of the case 4, and a connection portion 8c that connects the first joint portion 8a and the second joint portion 8b. The first joint portion 8a and the second joint portion 8b are parallel to the upper surface of the insulating substrate 1. The height of an upper surface of the electrode 5 is higher than the height of an upper surface of the metal wiring 3, and thus, the connection portion 8c obliquely rises toward the electrode 5 side from the metal wiring 3 side. In other words, the connection portion 8e is inclined with respect to the upper surface of the insulating substrate 1 on a cross-section along the extension direction of the lead frame 8.

Figure 3:
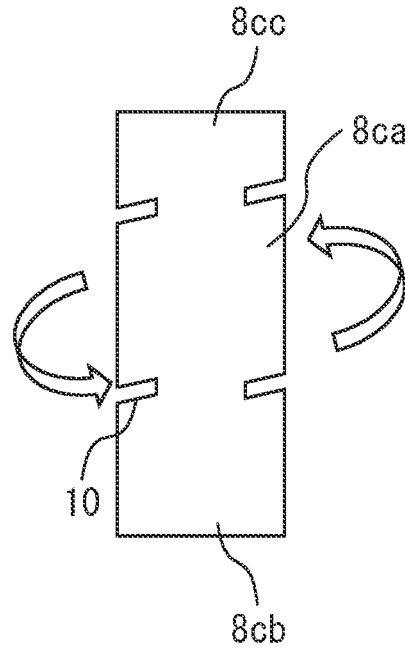
FIG. 3 is a plan view illustrating the connection portion of the lead frame according to the first embodiment.

FIG. 3 is a plan view illustrating the connection portion of the lead frame according to the first embodiment. The connection portion 8c includes an inclined portion 8ca, a first non-inclined portion 8cb provided between the inclined portion 8ca and the first joint portion 8a, and a second non-inclined portion 8cc provided between the inclined portion 8ca and the second joint portion 8b. At a boundary of the first non-inclined portion 8eb and the inclined portion 8ca and a boundary of the second non-inclined portion 8cc and the inclined portion 8ca, slits 10 are provided on both sides of the lead frame 8.

Figure 4:
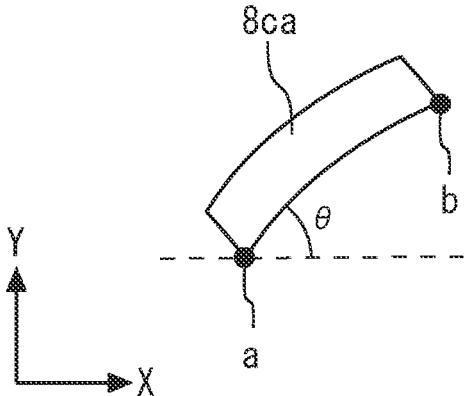
FIG. 4 is a cross-section view taken along the line a-b in FIG. 2.

FIG. 4 is a cross-section view taken along the line a-b in FIG. 2. This cross-section is a cross-section across the extension direction of the lead frame 8 and is a cross-section perpendicular to the upper surface of the insulating substrate 1. Note that the extension direction of the lead frame 8 is a direction from the metal wiring 3 side toward the electrode 5 side or an opposite direction thereof and is also a direction in which current flows to the lead frame 8. The inclined portion 8ca is twisted with respect to the first non-inclined portion 8cb and the second non-inclined portion 8cc and is inclined with respect to the upper surface of the insulating substrate 1 on a cross-section across the extension direction of the lead frame 8. On the other hand, the first non-inclined portion 8cb and the second non-inclined portion 8cc are not inclined on the cross-section.

Figure 5:
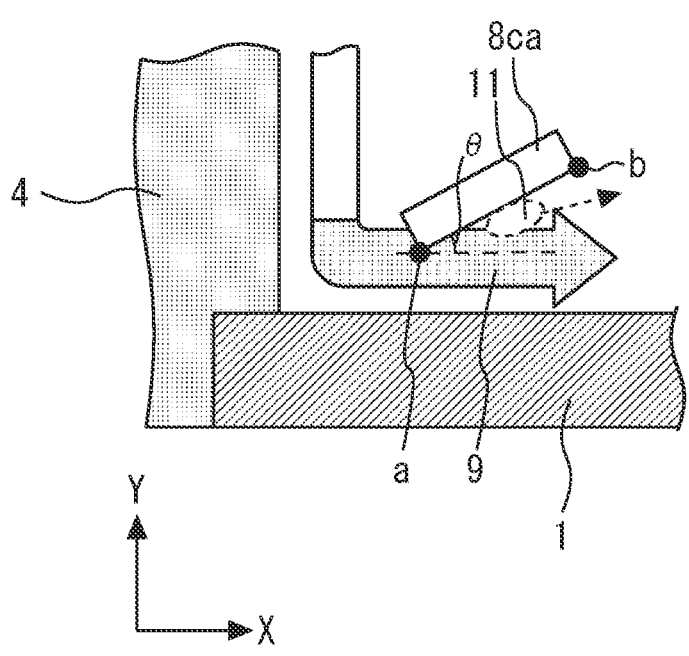
FIG. 5 is a cross-section view illustrating a process of sealing the semiconductor device according to the first embodiment.

FIG. 5 is a cross-section view illustrating a process of sealing the semiconductor device according to the first embodiment. The inclined portion 8ca of the lead frame 8 is inclined, and thus, the height of the side a is lower than the height of the side b of the lower surface of the inclined portion 8ca with respect to the upper surface of the insulating substrate 1. Thus, the seal material 9 is injected below the inclined portion 8ca of the lead frame 8 from the side a toward the side b. This makes it easier to extrude air bubbles 11 below the lead frame 8 above.

Figure 6:
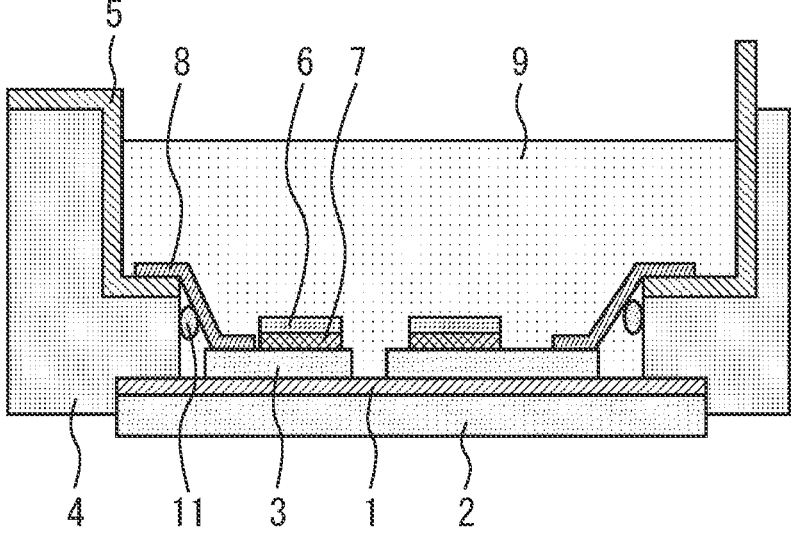
FIG. 6 is a cross-section view illustrating a semiconductor device according to the comparison example.

Subsequently, effects of the present embodiment will be described compared to a comparison example. FIG. 6 is a cross-section view illustrating a semiconductor device according to the comparison example. In the comparison example, the inclined portion 8ca is not provided in the lead frame 8. Thus, air below the lead frame 8 is less likely to escape above when the seal material 9 is injected. Thus, there is a case where the seal material 9 is cured in a state where the air bubbles 11 are confined in a narrow area enclosed with the internal side surface of the case 4, the side surface of the metal wiring 3, the upper surface of the insulating substrate 1, and the lower surface of the lead frame 8.

On the other hand, in the present embodiment, the inclined portion 8ca is provided in the lead frame 8. Thus, air below the inclined portion 8ca of the lead frame 8 is likely to be extruded above when the seal material 9 is injected. Thus, the air bubbles 11 are less likely to be trapped under the lead frame 8, so that it is possible to prevent decrease in reliability and an insulation failure.

It is necessary to twist the lead frame & to provide the inclined portion 8ca in the lead frame 8. However, in a case where an ordinary lead frame is twisted, an inclination angle at a portion where twisting is started is lower, and the air bubbles 11 are less likely to be let out at the portion. Thus, in the present embodiment, slits 10 are provided in the lead frame 8, and the lead frame 8 is twisted. This can increase the inclination angle θ of the inclined portion 8ca, so that air below the lead frame 8 is more likely to be extruded above. Further, the first joint portion 8a of the lead frame 8 joined to the metal wiring 3 of the insulating substrate 1 is maintained parallel with respect to the upper surface of the insulating substrate 1, so that it is possible to prevent a contact failure between the lead frame 8 and the metal wiring 3.

Figure 7:
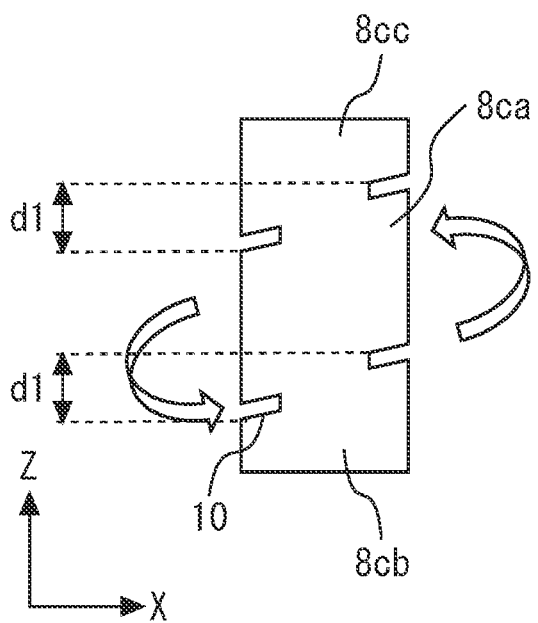
FIG. 7 is a plan view illustrating a modification of the connection portion of the lead frame according to the first embodiment.

FIG. 7 is a plan view illustrating a modification of the connection portion of the lead frame according to the first embodiment. Current flows in the extending direction (Y direction) of the lead frame 8, and thus, inductance increases as a minimum width (X direction) of the lead frame 8 is narrower. Thus, the position of the slit 10 on the left side of the lead frame 8 is shifted by a distance d1 from the position of the slit 10 on the right side of the lead frame 8 in the extending direction (Y direction) of the lead frame 8. This can make the minimum width of the lead frame 8 wider, so that it is possible to reduce inductance.

Second Embodiment

Figure 8:
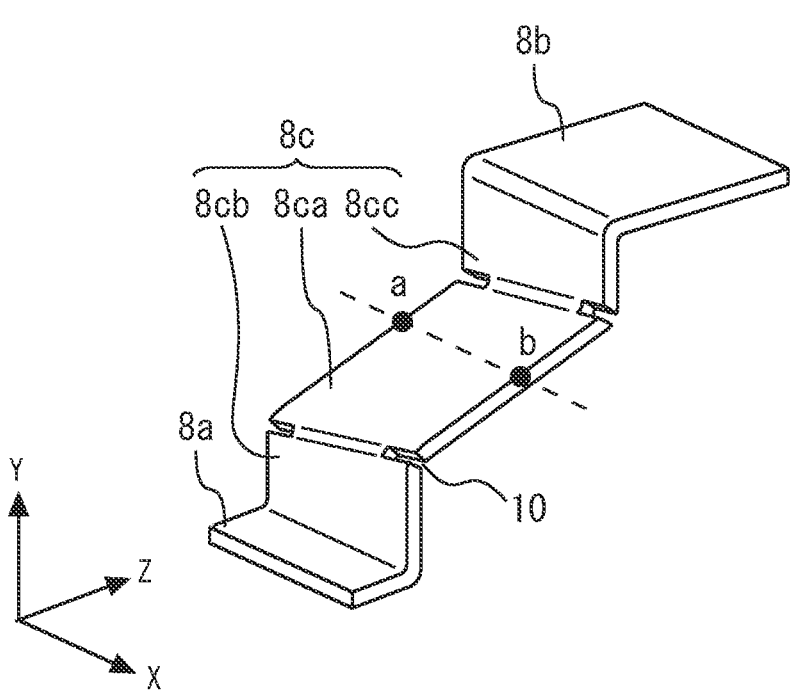
FIG. 8 is a perspective view illustrating a lead frame according to a second embodiment.
Figure 9:
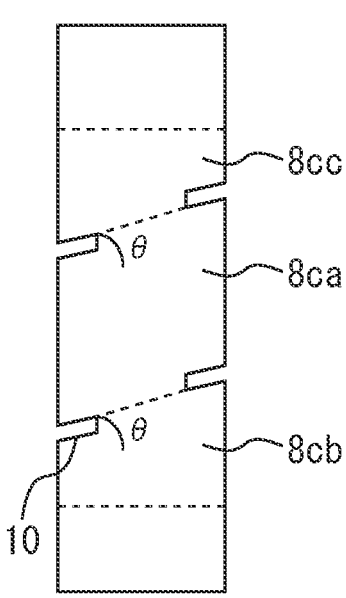
FIG. 9 is a plan view illustrating a connection portion of the lead frame according to the second embodiment.
Figure 10:
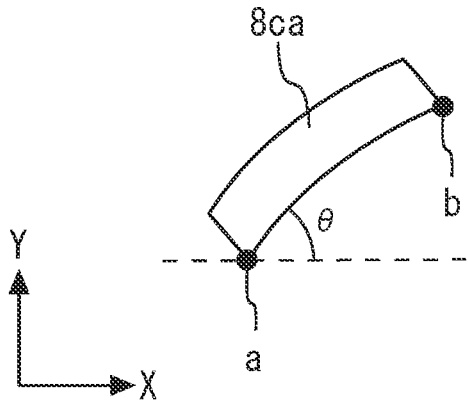
FIG. 10 is a cross-section view taken along the line a-b in FIG. 8.

FIG. 8 is a perspective view illustrating a lead frame according to a second embodiment. FIG. 9 is a plan view illustrating a connection portion of the lead frame according to the second embodiment. FIG. 10 is a cross-section view taken along the line a-b in FIG. 8.

The first non-inclined portion 8*cb* and the second non-inclined portion 8*cc* are respectively bent perpendicularly to the first joint portion 8*a* and the second joint portion 8*b* and extend perpendicularly to the upper surface of the insulating substrate 1. The inclined portion 8*ca* is formed by bending the lead frame 8 at an angle θ with respect to each of the first non-inclined portion 8*cb* and the second non-inclined portion 8*cc*. This makes it possible to easily form the inclined portion 8*ca* only by bending the lead frame 8. Other configurations of the semiconductor device are similar to those in the first embodiment. In a similar manner to the first embodiment, the air bubbles 11 are less likely to be trapped under the inclined portion 8*ca* of the lead frame 8, so that it is possible to prevent decrease in reliability and an insulation failure.

Third Embodiment

Figure 11:
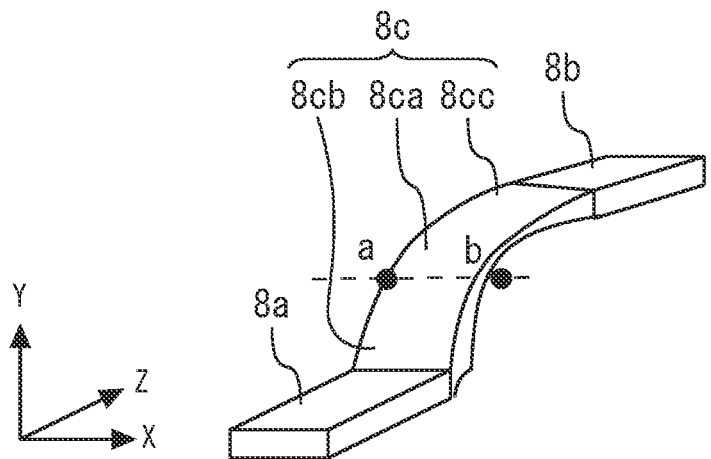
FIG. 11 is a perspective view illustrating a lead frame according to a third embodiment.
Figure 12:
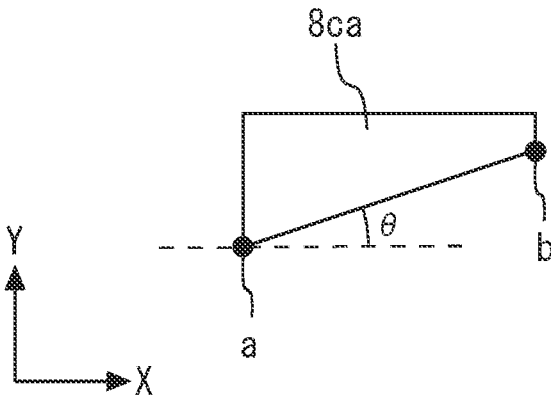
FIG. 12 is a cross-section view taken along the line a-b in FIG. 11.

FIG. 11 is a perspective view illustrating a lead frame according to a third embodiment. FIG. 12 is a cross-section view taken along the line a-b in FIG. 11. The upper surface of the inclined portion 8*ca* of the lead frame 8 is parallel to the upper surface of an insulating substrate 1 on a cross-section across the extension direction of the lead frame 8. On the other hand, the thickness of the inclined portion 8*ca* of the lead frame 8 changes in the width direction, and the lower surface of the inclined portion 8*ca* is inclined with respect to the upper surface of the insulating substrate 1 on the cross-section. Other configurations of the semiconductor device are similar to those in the first embodiment. In a similar manner to the first embodiment, the air bubbles 11 are less likely to be trapped under the inclined portion 8*ca* of the lead frame 8, so that it is possible to prevent decrease in reliability and an insulation failure.

Figure 13:
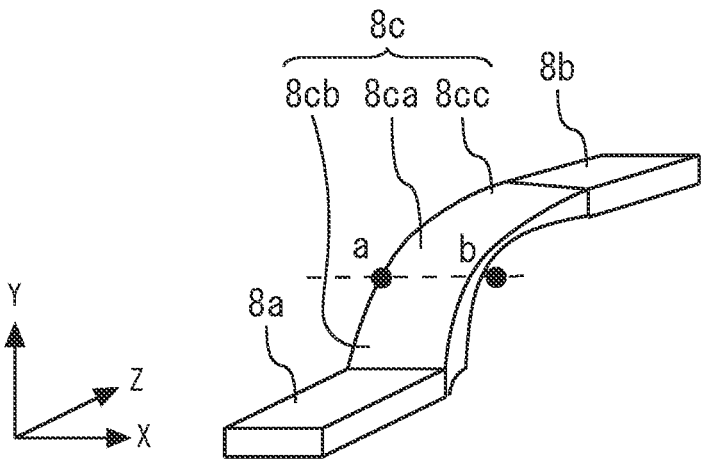
FIG. 13 is a perspective view illustrating a modification of the lead frame according to the third embodiment.
Figure 14:
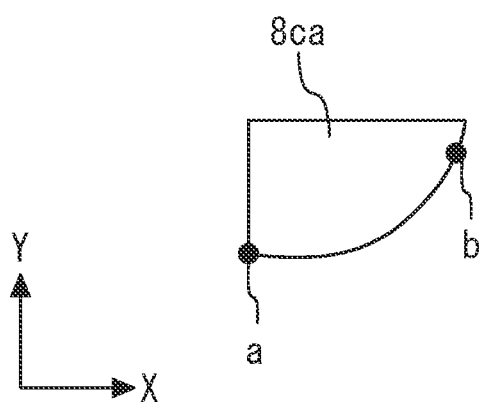
FIG. 14 is a cross-section view taken along the line a-b in FIG. 13.

FIG. 13 is a perspective view illustrating a modification of the lead frame according to the third embodiment. FIG. 14 is a cross-section view taken along the line a-b in FIG. 13. The lower surface of the inclined portion 8*ca* is an inclined curved surface. This makes it more likely to extrude air below the inclined portion 8*ca* above.

The semiconductor chip 6 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Further, the semiconductor chip 6 of a wide bandgap semiconductor generates a large amount of heat, and thus, it is necessary to use a seal material 9 containing a large amount of heat resistance additive. Air bubbles are more likely to be generated by the seal material 9 containing the large amount of the heat resistance additive, and thus, the above-described embodiments are particularly effective.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

Supplementary Note 1

A semiconductor device comprising:

an insulating substrate;

a metal wiring provided on an upper surface of the insulating substrate;

a case joined to a peripheral portion on the upper surface of the insulating substrate;

a semiconductor chip mounted on the upper surface of the insulating substrate inside the case;

an electrode provided in the case;

a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion.

the connection portion includes an inclined portion inclined with respect to the upper surface of the insulating substrate on a cross-section across an extension direction of the lead frame, a first non-inclined portion provided between the inclined portion and the first joint portion, and a second non-inclined portion provided between the inclined portion and the second joint portion, and slits are provided on both sides of the lead frame at a boundary of the first non-inclined portion and the inclined portion and a boundary of the second non-inclined portion and the inclined portion.

Supplementary Note 2

The semiconductor device according to Supplementary Note 1, wherein a position of the slit on a left side of the lead frame is shifted from a position of the slit on a right side of the lead frame in an extending direction of the lead frame.

Supplementary Note 3

The semiconductor device according to Supplementary Note 1 or 2, wherein the first non-inclined portion and the second non-inclined portion extend perpendicularly to the upper surface of the insulating substrate.

Supplementary Note 4

A semiconductor device comprising:

an insulating substrate;

a metal wiring provided on an upper surface of the insulating substrate;

a case joined to a peripheral portion on the upper surface of the insulating substrate;

a semiconductor chip mounted on the upper surface of the insulating substrate inside the case;

an electrode provided in the case;

a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion, the connection portion includes an inclined portion, a thickness of the inclined portion changes in a width direction of the lead frame, and a lower surface of the inclined portion is inclined with respect to the upper surface of the insulating substrate on a cross-section across an extension direction of the lead frame.

Supplementary Note 5

The semiconductor device according to Supplementary Note 4, wherein a lower surface of the inclined portion is an inclined curved surface.

Supplementary Note 6

The semiconductor device according to any one of Supplementary Notes 1 to 5, wherein the semiconductor chip is formed of a wide-bandgap semiconductor.

Supplementary Note 7

A method for manufacturing the semiconductor device according to any one of Supplementary Notes 1 to 6, wherein a height of a first side of a lower surface of the inclined portion is lower than a height of a second side of the lower surface of the inclined portion with respect to the upper surface of the insulating substrate, and the seal material is injected below the inclined portion from the first side toward the second side.

REFERENCE SIGNS LIST 1 insulating substrate; 3 metal wiring; 4 case; 5 electrode; 6 semiconductor chip; 8 lead frame; 8a first joint portion; 8b second joint portion; 8c connection portion; 8ca inclined portion; 8cb first non-inclined portion; 8cc second non-inclined portion; 9 seal material; 10 slit Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2023-052031, filed on Mar. 28, 2023 including specification, claims, drawings and summary, on which the convention priority of the present application is based, is incorporated herein by reference in its entirety.

The invention claimed is:

1. A semiconductor device comprising:

an insulating substrate;

a metal wiring provided on an upper surface of the insulating substrate;

a case joined to a peripheral portion on the upper surface of the insulating substrate; a semiconductor chip mounted on the upper surface of the insulating substrate inside the case;

an electrode provided in the case;

a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion, the connection portion includes an inclined portion having a lower surface that is inclined with respect to the upper surface of the insulating substrate when viewed in a cross-section across an extension direction of the lead frame, a first non-inclined portion provided between the inclined portion and the first joint portion, and a second non-inclined portion provided between the inclined portion and the second joint portion, and a plurality of slits, a respective slit of the plurality of slits is provided on each side of the lead frame at a boundary of the first non-inclined portion and the inclined portion and a boundary of the second non-inclined portion and the inclined portion, wherein the extension direction of the lead frame is a direction from the metal wiring toward the electrode or a direction from the electrode toward the metal wiring.

2. The semiconductor device according to claim 1, wherein a position of a slit of the plurality of slits on a first side of the lead frame is shifted in the extension direction of the lead frame from a position of a slit of the plurality of slits on a second side of the lead frame.

3. The semiconductor device according to claim 1, wherein the first non-inclined portion and the second non-inclined portion extend perpendicularly to the upper surface of the insulating substrate.

4. The semiconductor device according to claim 2, wherein the first non-inclined portion and the second non-inclined portion extend perpendicularly to the upper surface of the insulating substrate.

5. The semiconductor device according to claim 1, wherein the semiconductor chip is formed of a wide-bandgap semiconductor.

6. The semiconductor device according to claim 2, wherein the semiconductor chip is formed of a wide-bandgap semiconductor.

7. The semiconductor device according to claim 3, wherein the semiconductor chip is formed of a wide-bandgap semiconductor.

8. The semiconductor device according to claim 4, wherein the semiconductor chip is formed of a wide-bandgap semiconductor.

9. A method for manufacturing the semiconductor device according to claim 1, wherein a height of a first side of the lower surface of the inclined portion is lower than a height of a second side of the lower surface of the inclined portion with respect to the upper surface of the insulating substrate, and the seal material is injected below the inclined portion from the first side toward the second side.

10. A semiconductor device comprising:

an insulating substrate;

a metal wiring provided on an upper surface of the insulating substrate;

a case joined to a peripheral portion on the upper surface of the insulating substrate;

a semiconductor chip mounted on the upper surface of the insulating substrate inside the case;

an electrode provided in the case;

a lead frame connecting the metal wiring and the electrode; and a seal material filled in the case and sealing the upper surface of the insulating substrate, the semiconductor chip and the lead frame, wherein the lead frame includes a first joint portion joined to the metal wiring, a second joint portion joined to the electrode, and a connection portion connecting the first joint portion and the second joint portion, the connection portion includes an inclined portion, a thickness of the inclined portion changes in a width direction of the lead frame when viewed in a cross-section across an extension direction of the lead frame, and

10 a lower surface of the inclined portion is inclined with respect to the upper surface of the insulating substrate when viewed in the cross-section, wherein the extension direction of the lead frame is a direction from the metal wiring toward the electrode or a direction from the electrode toward the metal wiring.

11. The semiconductor device according to claim 10, wherein the lower surface of the inclined portion is an inclined curved surface.

12. The semiconductor device according to claim 10, wherein the semiconductor chip is formed of a wide-band-gap semiconductor.

13. The semiconductor device according to claim 11, wherein the semiconductor chip is formed of a wide-band-gap semiconductor.

14. A method for manufacturing the semiconductor device according to claim 10, wherein a height of a first side of the lower surface of the inclined portion is lower than a height of a second side of the lower surface of the inclined portion with respect to the upper surface of the insulating substrate, and the seal material is injected below the inclined portion from the first side toward the second side.

* * * * *